(12) United States Patent
Chen

(10) Patent No.: US 8,558,606 B2
(45) Date of Patent: Oct. 15, 2013

(54) DEBOUNCE APPARATUS AND METHOD THEREOF

(75) Inventor: Chia-Hsiang Chen, Taipei (TW)

(73) Assignee: Inventec Corporation, Taipei (TW)

( * ) Notice: Subject to any disclaimer, the term of this patent is extended or adjusted under 35 U.S.C. 154(b) by 12 days.

(21) Appl. No.: 13/337,816

(22) Filed: Dec. 27, 2011

(65) Prior Publication Data

US 2013/0127517 A1 May 23, 2013

(30) Foreign Application Priority Data

Nov. 22, 2011  (TW) .............................. 100142635 A

(51) Int. Cl.
*H03K 17/16* (2006.01)

(52) U.S. Cl.
USPC .............................. 327/385; 327/34; 327/309

(58) Field of Classification Search
USPC ............................................ 327/385, 34, 309
See application file for complete search history.

(56) References Cited

U.S. PATENT DOCUMENTS

| 4,617,677 A * | 10/1986 | Chiba | 375/340 |
| 4,926,072 A * | 5/1990 | Hyodo | 327/22 |
| 5,315,539 A * | 5/1994 | Hawes | 708/300 |
| 7,506,810 B2 * | 3/2009 | Whaley et al. | 235/441 |
| 7,847,614 B2 * | 12/2010 | Taylor | 327/384 |
| 2005/0270042 A1 * | 12/2005 | Doljack | 324/686 |

FOREIGN PATENT DOCUMENTS

| TW | 200538912 | 12/2005 |
| TW | 200636413 | 10/2006 |

* cited by examiner

*Primary Examiner* — Long Nguyen
*Assistant Examiner* — Patrick Chen
(74) *Attorney, Agent, or Firm* — CKC & Partners Co., Ltd.

(57) ABSTRACT

A debounce apparatus and a method thereof are provided, which includes a debounce module, a register and a timer. The debounce module receives an input signal and eliminates a bounce phenomenon of the input signal within a transient-time of the state-changing of the input signal to produce a debounce signal. The register outputs an output signal according to the value stored in the register. When the input signal changes its state, the timer starts time-counting according to a counting-value of settling-time; when the debounce signal changes its state, the timer recounts time; and when time-counting is ended and when the value corresponding to the debounce signal is different from the register's value, the register's value is updated by the value corresponding to the debounce signal. In this way, the apparatus can eliminate the system misjudgement problem caused by occurred voltage level errors in the stable state.

6 Claims, 5 Drawing Sheets

DEBOUNCE APPARATUS AND METHOD THEREOF

CROSS-REFERENCE TO RELATED APPLICATION

This application claims the priority benefit of Taiwan application serial no. 100142635, filed on Nov. 22, 2011. The entirety of the above-mentioned patent application is hereby incorporated by reference herein and made a part of this specification.

BACKGROUND OF THE INVENTION

1. Field of the Invention

The invention generally relates to a debounce circuit, and more particularly, to a debounce apparatus able to make a composite judgment by counting a settling-time so as to eliminate the bounce phenomena.

2. Description of Related Art

During a system control process, signals are transmitted between components where the output signal of the previous stage usually serves as the input signal of the next stage. However, during transmitting signals, the signals output from the components, such as the signals input by a keyboard or keys, are not ones with ideal and perfect waveforms. According to the physical nature, when a characteristic or an electrical level is instantly changed, it is unable to change the state immediately. Instead, a reaction is produced, and in view of digital signal, before the signal enters the stable output state, a bounce phenomenon occurs where multiple digits 0 and 1 alternately move up and down. The phenomenon makes the system treat the signal at the input terminal thereof as a continuous input signal, which leads a state misjudgement and an error message.

In particular for some devices on a system, in terms of the setting of logic judgment, once a state-changing phenomenon is detected out, the system would enter a phase to process the voltage or the error message. Even further, an unstable signal may cause a system shutdown or crash. In this regard, prior to inputting the output signals of many devices to the components of the next stage, a debounce circuit is used to debounce and the input signal is transferred to the output signal through a debounce delay buffer until the state gets stable; and at the time, the signal is input to the component of the next stage.

FIG. 1 is a schematic block diagram of a conventional debounce circuit 10. Referring to FIG. 1, in a conventional debounce circuit, a flip-flop serial is employed serving as the design architecture. Only when all the output states of the flip-flop serial are the same, the output signals can change the states thereof. The more the flip-flops in series connection, the better the effect of the debounce circuit is; but such scheme easily leads to an excessive delay of the signal, reduces the response time of the system and is unable to achieve an immediate control effect.

For the currently available debounce circuits, if a wrong voltage level under a stable state occurs, the voltage level error would pass the filtering of the debounce circuit so as to cause a misjudgement of the system. Therefore, how to develop a debounce apparatus able to eliminate the influence of voltage level error under a stable state is a project to be solved.

SUMMARY OF THE INVENTION

Accordingly, the invention is directed to a debounce apparatus and a method thereof which can effectively solve the problem caused by an occurred voltage level error under a stable state.

The invention provides a debounce apparatus, which includes a debounce module, a register and a timer. The debounce module is configured for receiving an input signal and eliminating a bounce phenomenon of the input signal within a transient-time of the state-changing of the input signal so as to produce a debounce signal. The register is configured for outputting an output signal according to a value stored in the register. The timer is coupled to the debounce module and the register, in which when the input signal changes its state, the timer starts time-counting according to a counting-value of settling-time, and when the debounce signal changes its state, the timer recounts time. When the timer ends time-counting and when the value corresponding to the debounce signal is different from the value stored in the register, the value stored in the register is updated by the value corresponding to the debounce signal.

In an embodiment of the present invention, the debounce apparatus further includes a counting module coupled to the timer for receiving the input signal, in which the counting module counts the duration for the input signal being changing the state thereof so as to obtain a present counting-value of signal change. If the present counting-value of signal change is greater than a maximal counting-value of signal change, the maximal counting-value of signal change is substituted by the present counting-value of signal change and the counting-value of settling-time is updated.

In an embodiment of the present invention, when the input signal changes its state, the counting module clears a queue and re-samples the input signal in fixed clocks and pushes the sampled signal into the queue. If the values obtained by sampling the input signal keep the same, the number of the values stored in the queue is counted so as to obtain the present counting-value of signal change.

In an embodiment of the present invention, the above-mentioned timer is in an initial state, the debounce apparatus outputs the output signal according to the value corresponding to the debounce signal.

In an embodiment of the present invention, the above-mentioned timer further includes a counting-value table of settling-time, in which a plurality of counting-values of settling-time corresponding to a plurality of devices are stored in the counting-value table of settling-time, and when the input signal changes its state, the timer starts time-counting according to the counting-value of settling-time corresponding to the device producing the input signal.

In another aspect, the invention provides a debounce apparatus, which includes a debounce module, a counting module, a register, a switch module and a timer. The debounce module is configured for receiving an input signal and eliminating a bounce phenomenon of the input signal within a transient-time of the state-changing of the input signal so as to produce a debounce signal. The counting module is configured for receiving the input signal, in which the counting module counts the duration for the input signal being changing the state thereof so as to obtain a present counting-value of signal change. If the present counting-value of signal change is greater than a maximal counting-value of signal change, the maximal counting-value of signal change is substituted by the present counting-value of signal change and a counting-value of settling-time is updated. The register is configured for outputting a stable signal according to a value stored in the register. The switch module is coupled to the debounce module and the register for selecting one of the debounce signal and the stable signal to output an output signal. The timer is coupled to the debounce module, the register and the counting module, in which when the input signal changes its state, the timer starts time-counting according to a counting-value of settling-time. When the debounce signal changes its state, the timer recounts time. When the timer ends time-counting and when the value corresponding to the debounce signal is different from the stored value in the register, the value stored in the register is updated by the value corresponding to the debounce signal and the switch module selects the stable signal to output the output signal. When the timer is in an initial state, the switch module selects the debounce signal to output the output signal.

The invention further provides a debounce method, which includes: receiving an input signal and eliminating a bounce phenomenon of the input signal within a transient-time of the state-changing of the input signal so as to produce a debounce signal; when the input signal changes its state, starting time-counting according to a counting-value of settling-time; when the debounce signal changes its state, recounting time; and when time-counting is ended and when the debounce signal is different from an output signal, the output signal is updated by the debounce signal.

Based on the description above, the invention makes a composite judgment by counting a settling-time, which can effectively eliminate the influence of an occurred voltage level error under a stable state.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
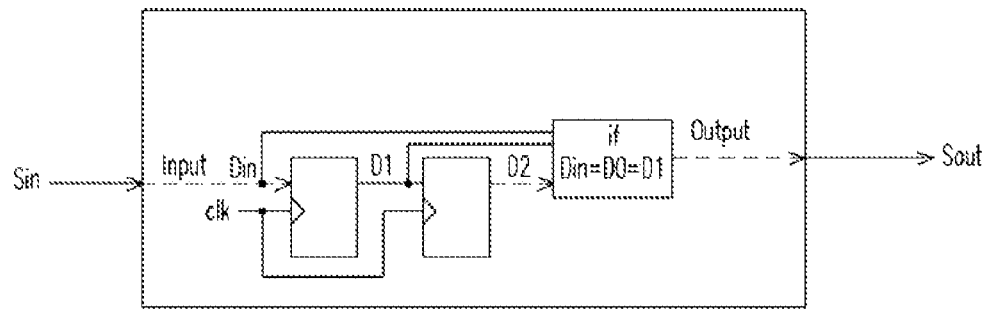
FIG. 1 is a schematic block diagram of a conventional debounce circuit.

Reference will now be made in detail to the preferred embodiments of the invention, examples of which are illustrated in the accompanying drawings. Wherever possible, the same reference numbers are used in the drawings and the description to refer to the same or like parts.

Figure 2:
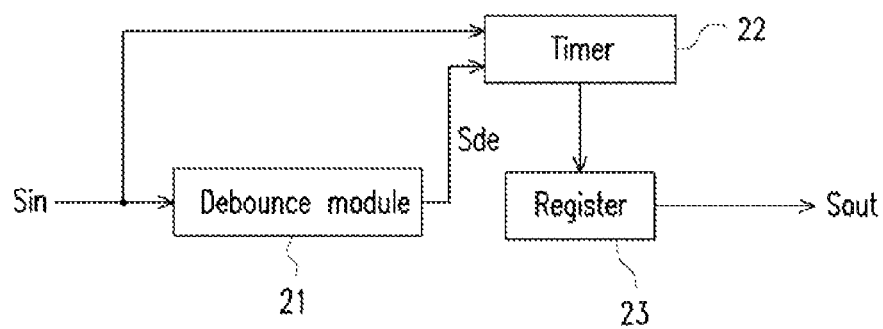
FIG. 2 is a schematic block diagram of a debounce apparatus according to an embodiment of the invention.

FIG. 2 is a schematic block diagram of a debounce apparatus 20 according to an embodiment of the invention. Referring to FIG. 2, a debounce apparatus 20 includes a debounce module 21, a timer 22 and a register 23. In the embodiment, the debounce module 21 receives an input signal Sin, and eliminates the bounce phenomenon of the input signal Sin through the delay buffer of the debounce within the transient-time of the state-changing of the input signal Sin so as to produce a debounce signal Sde. For example, the debounce module 21 can be the conventional debounce circuit 10 shown by FIG. 1. The register 23 is mainly for outputting an output signal Sout according to the value stored in the register 23. The timer 22 is coupled to the debounce module 21 and register 23 to delay the debounce signal Sde through the timer 22, which is able to make an additional composite judgment on the variation of the debounce signal Sde.

Figure 3:
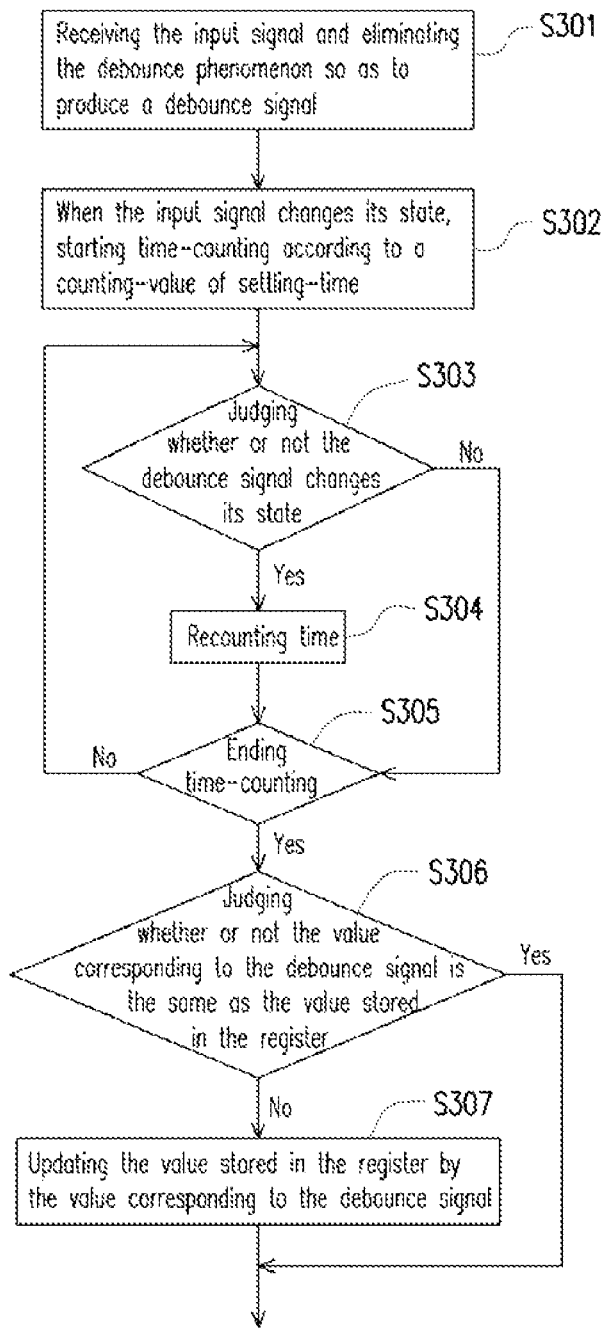
FIG. 3 is a flowchart of a debounce method according to an embodiment of the invention.

FIG. 3 is a flowchart of a debounce method according to an embodiment of the invention. Referring to FIGS. 2 and 3, first, step S301 is conducted, the debounce apparatus 20 receives the input signal Sin and, when the input signal Sin changes its state, the debounce module 21 eliminates the bounce phenomenon of the input signal Sin within the transient-time of the state-changing of the input signal Sin so as to produce a debounce signal Sde. Meanwhile, step S302 is conducted as well, where when the input signal Sin changes its state, the timer 22 starts time-counting according to a counting-value of settling-time, for example, the timer 22 starts countdown according to a counting-value of settling-time. If the time-counting is not ended, for example, the preset countdown duration is not over while the debounce signal Sde changes its state, the situation indicates the system may have a voltage level error under the stable state or may be affected by noise so that the input signal Sin changes its state. At the time, the debounce apparatus 20 should not change the output signal Sout.

Then, the debounce apparatus 20 conducts step S303 where it is judged whether or not the debounce signal Sde changes its state, that is to say, it is judged whether or not the debounce signal Sde changes its level from 0 to 1 or from 1 to 0. When the input signal Sin changes its state, step S304 is conducted where the timer 22 is interrupted to recount time. If the debounce signal Sde does not change its state or step S304 is completed, the workflow enters step S305 where it is judged whether or not the time length counted by the timer 22 reaches or exceeds the above-mentioned counting-value of settling-time. If the time length counted by the timer 22 reaches or exceeds the above-mentioned counting-value of settling-time, the timer 22 ends time-counting. For example, if the countdown duration is over, the workflow jumps to step S306; if the time-counting is not ended, the time-counting keeps going and the workflow goes back to step S303.

When the timer 22 ends the time-counting, step S306 is conducted. In step S306, the value corresponding to the debounce signal Sde is compared with the value stored in the register 23. When the value corresponding to the debounce signal Sde is not the same as the value stored in the register 23 for indicating the state-changing of the input signal Sin has reached the stable state, step S307 is conducted where the value stored in the register 23 is updated by the value corresponding to the debounce signal Sde and the register 23 outputs the output signal Sout. At the time, the output signal Sout is updated by the debounce signal Sde. If the value corresponding to the debounce signal Sde is the same as the value stored in the register 23, it keeps outputting the output signal Sout with the value stored in the register 23, which indicates the state-changing of the input signal Sin may be caused by noise interference and thus the value stored in the register 23 would not be adjusted.

Figure 4:
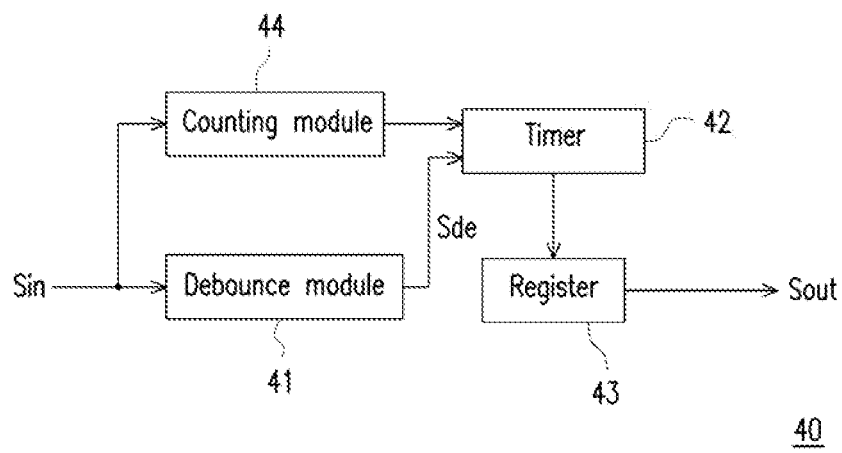
FIG. 4 is a schematic block diagram of a debounce apparatus according to another embodiment of the invention.

FIG. 4 is a schematic block diagram of a debounce apparatus 40 according to another embodiment of the invention. The embodiment of FIG. 4 can refer to the descriptions of FIGS. 2 and 3, while the difference from the embodiment of FIG. 2 rests in that the debounce apparatus 40 of FIG. 4 further includes counting module 44 coupled to a timer 42. The counting module 44 is configured mainly for receiving the input signal Sin and counting the duration for the input signal Sin being changing the state thereof so as to obtain a present counting-value of signal change.

Figure 5:
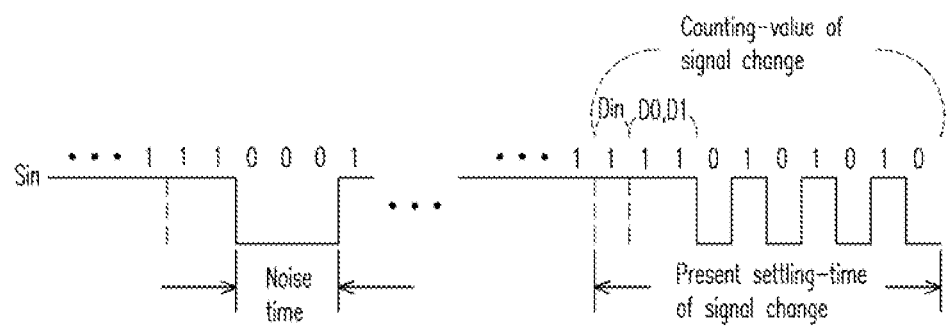
FIG. 5 is a schematic diagram illustrating counting an input signal according to another embodiment of the invention.
Figure 6:
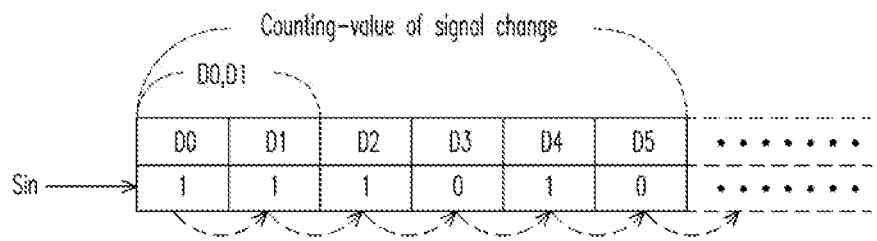
FIG. 6 is a schematic architecture diagram showing a queue of input signal according to another embodiment of the invention.

FIG. 5 is a schematic diagram illustrating counting an input signal Sin according to another embodiment of the invention. Referring to FIGS. 4 and 5, during the counting module 44 counts the duration for the input signal Sin is changing the state thereof, the counting module 44 samples the input signal Sin in fixed clocks until the input signal Sin keeps the same, and at the time it indicates the input signal Sin has reached a stable state. In the embodiment, an architecture of two flip-flops serves as an example. When the values of the input signal Sin sampled in three consecutive clocks are the same, the input signal Sin is considered in a stable state. FIG. 6 is a schematic architecture diagram showing a queue of input signal Sin according to another embodiment of the invention. When the input signal Sin changes its state, the counting module 44 clears the data in the queue, then, samples the input signal Sin in fixed clocks followed by pushing the sampled values into the queue. If the sampled values of the input signal Sin keep the same, the number of the value stored in the register is counted so as to obtain the present counting-value of signal change. In the embodiment, the present counting-value of signal change is six.

Figure 7:
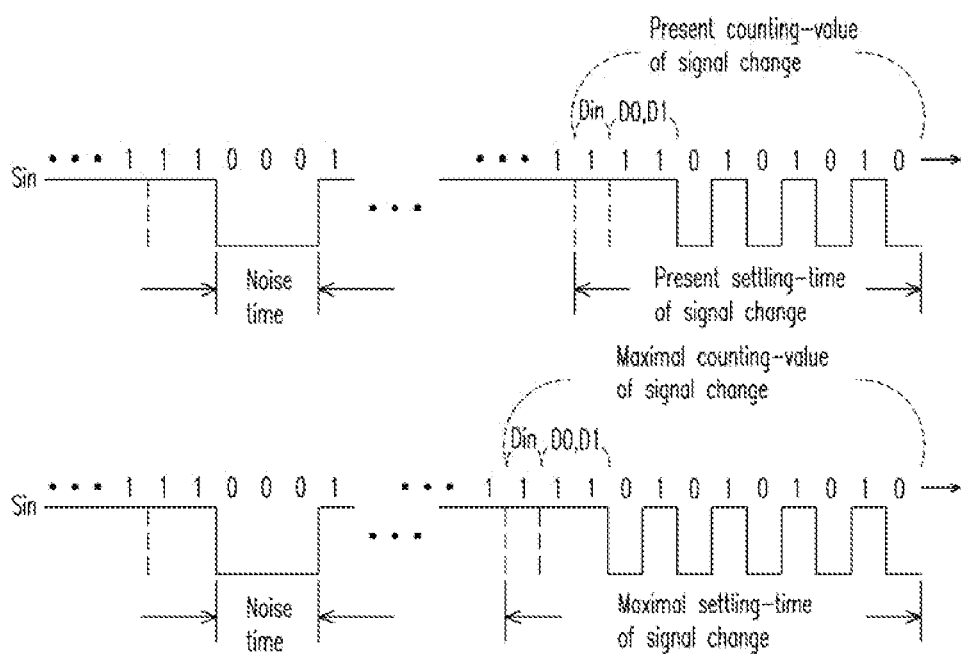
FIG. 7 is a schematic diagram showing a comparison of a present counting-value of signal changes with a maximal counting-value of signal change according to another embodiment of the invention.

FIG. 7 is a schematic diagram showing a comparison of a present counting-value of signal changes with a maximal counting-value of signal change according to another embodiment of the invention. Referring to FIGS. 4 and 7, if the present counting-value of signal change is greater than the maximal counting-value of signal change previously counted by the counting module 44, the maximal counting-value of signal change is substituted by the present counting-value of signal change, and meanwhile, the above-mentioned counting-value of settling-time is updated as well.

In order to be more clear, the settling-time required by the input signal Sin of the apparatus can be obtained through multiplying the above-mentioned counting-value of signal change by the fixed clock period. In this way, the maximal counting-value of signal change can be found out and the maximal settling-time is obtained for enhancing the stability of the system. Since the noise time producing error is very short, when the signal gets noise, the noise time producing error should be compared with the settling-time; once the noise time does not exceed the maximal settling-time, the signal would not be sent to the system.

Continuing to FIG. 4, in the embodiment, the timer 42 further includes a counting-value table of settling-time. After the electronic apparatus is operated for some time, or due to the temperature rising, the electronic apparatus may change the signal stability. In order to solve the problem, the invention is designed to obtain the present counting-value of signal change during the input signal Sin is changing its state to update the counting-value of settling-time required by all the devices so as to reach the best noise-proof capability. Various devices require different counting-value of settling-times. If only one fixed delay time is available for all the devices, the system control efficiency is reduced, so that it is needed to perform automatic detection of settling-time on each of the devices, such as two central processing unit (CPUs) CPU1 and CPU2, two memories MEM01 and MEM23, a 5V voltage regulating device VRD_5V, a 3.3V voltage regulating device VRD_3.3V, etc. The counting-value table of settling-time is configured for storing a plurality of counting-values of settling-time corresponding to a plurality of devices. When the input signal Sin changes its state, the timer 42 starts time-counting according to the counting-value of settling-time corresponding to the device producing the input signal Sin so as to perform a composite control on the device producing the input signal Sin.

In the embodiment, prior to obtaining any present counting-value of signal change by the counting module 44, the timer 42 is in an initial state and the above-mentioned counting-value of settling-time has no initial preset value. At the time, the debounce apparatus 40 outputs the output signal Sout according to the value corresponding to the debounce signal Sde. The judgment scheme and the operation of the embodiment is the same as the above-mentioned first embodiment, which is omitted to describe.

Figure 8:
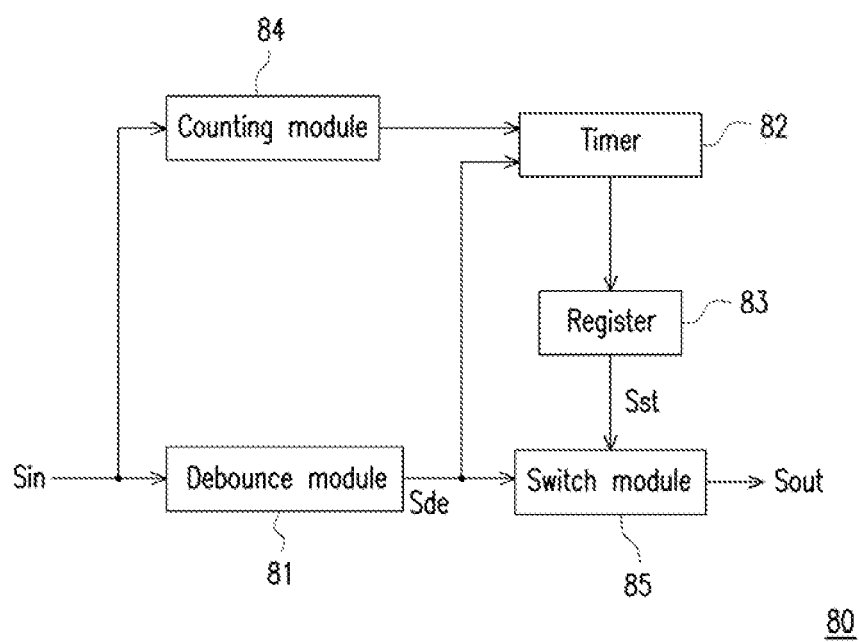
FIG. 8 is a schematic block diagram of a debounce apparatus according to yet another embodiment of the invention.

FIG. 8 is a schematic block diagram of a debounce apparatus 80 according to yet another embodiment of the invention. The embodiment of FIG. 8 can refer to the description of FIG. 3 except that the debounce apparatus 80 further includes a switch module 85. In the embodiment, the register 83 outputs a stable signal Sst according to the values stored in the register 83. The switch module 85 is coupled to a debounce module 81 and the register 83 mainly for selecting one of the debounce signal Sde and the stable signal Sst to output the output signal Sout.

In the embodiment, when the timer 82 ends the time-counting and when the value corresponding to the debounce signal Sde is different from the value stored in the register 83, it indicates the change of the debounce signal Sde has reached the stable state, so that the value corresponding to the debounce signal Sde is stored in the register 83 and at the time, the switch module 85 selects the stable signal Sst output from the register 83 as the output signal Sout for outputting. When the counting module 84 has not obtained any present counting-value of signal change, i.e., the timer 82 is in the initial state, the switch module 81 selects the debounce signal Sde as the output signal Sout for outputting. The judgment scheme and the operation of the embodiment is the same as the above-mentioned second embodiment, which is omitted to describe.

In order to avoid the apparatus from a wrong action to affect the normal operation thereof (for example, the apparatus immediately starts up in response to turning-on), an initial value is preset in the register 23. The initial value is determined according to the action type of the external device to be controlled. If the action scheme of the external device controlled by the output signal Sout is an active Low mode, the initial value for the register 23 in the beginning operation of the system is preset as Hi (logic 1). On the contrary, if the action scheme of the external device controlled by the output signal Sout is an active Hi mode, the initial value for the register 23 in the beginning operation of the system is preset as Low (logic 0).

Based on the description of the above-mentioned embodiments, the debounce method of the embodiment further includes following steps:

receiving an input signal and eliminating a bounce phenomenon of the input signal within a transient-time of the state-changing of the input signal so as to produce a debounce signal;

when the input signal changes its state, starting time-counting according to a counting-value of settling-time;

when the debounce signal changes its state, recounting time; and when time-counting is ended and when the debounce signal is different from an output signal, the output signal is updated by the debounce signal; when the debounce signal is the same as the output signal, the stable signal serves as the output signal for outputting.

It should be noted that the above-mentioned embodiments are only for explaining the concept of the invention, not to limit the real applications of the invention.

In summary, the invention uses a scheme of counting the settling-time, in association with a debounce module, to perform a composite judgment and eliminate the bounce phenomenon. Meanwhile, it can start time-counting according to the counting-value of settling-time corresponding to the device producing the input signal so as to calculate out the settling-time required by each of the devices, which can set the delay time of each device according to the characteristic thereof and effectively solve the system misjudgement problem caused by an occurred voltage level error in the stable state.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A debounce apparatus, comprising:
    a debounce module, configured for receiving an input signal and eliminating a bounce phenomenon of the input signal within a transient-time of a state-changing of the input signal so as to produce a debounce signal;
    a register, configured for outputting an output signal according to a value stored in the register;
    a timer, coupled to the debounce module and the register, wherein when the input signal changes its state, the timer starts time-counting according to a counting-value of settling-time, and when the debounce signal changes its state, the timer recounts time, and
    a counting module, coupled to the timer for receiving the input signal, configured for counts a duration for the input signal being changing the state thereof so as to obtain a present counting-value of signal change,
    wherein when the input signal changes its state, the counting module clears a queue and re-samples the input signal in fixed clocks and pushes a sampled signal into the queue; in a condition that the values obtained by sampling the input signal keep the same, the number of the values stored in the queue is counted so as to obtain the present counting-value of signal change,
    wherein in a condition that the present counting-value of signal change is greater than a maximal counting-value of signal change, the maximal counting-value of signal change is substituted by the present counting-value of signal change and the counting-value of settling-time is updated, and
    wherein when the timer ends time-counting and when a value corresponding to the debounce signal is different from the value stored in the register, the value stored in the register is updated by the value corresponding to the debounce signal.

2. The debounce apparatus as claimed in claim 1, wherein when the timer is in an initial state, the debounce apparatus outputs the output signal according to the value corresponding to the debounce signal.

3. The debounce apparatus as claimed in claim 1, wherein the timer further comprises a counting-value table of settling-time, a plurality of counting-values of settling-time corresponding to a plurality of devices are stored in the counting-value table of settling-time, and when the input signal changes its state, the timer starts time-counting according to the counting-value of settling-time corresponding to the device producing the input signal.

4. A debounce method, comprising:
    receiving an input signal and eliminating a bounce phenomenon of the input signal within a transient-time of the state-changing of the input signal so as to produce a debounce signal;
    when the input signal changes its state, starting time-counting according to a counting-value of settling-time;
    when the debounce signal changes its state, recounting time, and counting a duration for the input signal being changing the state thereof so as to obtain a present counting-value of signal change; and
    when time-counting is ended and when the debounce signal is different from an output signal, the output signal is updated by the debounce signal,
    wherein when the input signal changes its state, the method further comprises clearing a queue and re-sampling the input signal in fixed clocks and pushing the sampled signal into the queue; in a condition that the values obtained by sampling the input signal keep the same, the number of the values stored in the queue is counted so as to obtain the present counting-value of signal change, wherein in a condition that the present counting-value of signal change is greater than a maximal counting-value of signal change, the maximal counting-value of signal change is substituted by the present counting value of signal change and the counting-value of settling-time is updated.

5. The debounce method as claimed in claim 4, wherein when time-counting is in an initial state, the debounce signal is used to output the output signal.

6. The debounce method as claimed in claim 4, further comprising:
    providing a counting-value table of settling-time, wherein a plurality of counting-values of settling-time corresponding to a plurality of devices are stored in the counting-value table of settling-time, and when the input signal changes its state, the method further comprises starting time-counting according to the counting-value of settling-time corresponding to the device producing the input signal.

* * * * *